US006881968B2

(12) United States Patent
Yamada

(10) Patent No.: US 6,881,968 B2
(45) Date of Patent: Apr. 19, 2005

(54) ELECTRON BEAM EXPOSURE APPARATUS, ELECTRON BEAM EXPOSURE METHOD, SEMICONDUCTOR DEVICE MANUFACTURING METHOD, AND ELECTRON BEAM SHAPE MEASURING METHOD

(75) Inventor: Akio Yamada, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 10/422,407

(22) Filed: Apr. 23, 2003

(65) Prior Publication Data

US 2003/0197135 A1 Oct. 23, 2003

Related U.S. Application Data

(63) Continuation of application No. PCT/JP02/04676, filed on May 15, 2002.

(30) Foreign Application Priority Data

Jun. 18, 2001 (JP) ....................................... 2001-183478

(51) Int. Cl.$^{7}$ ...................... H01J 37/317; H01J 37/302; H01J 37/12; H01J 37/14

(52) U.S. Cl. ............................ 250/492.23; 250/492.21; 250/492.22; 250/492.1; 250/492.2; 250/492.3

(58) Field of Search .............................. 250/492.21–23, 250/310, 311, 396 ML, 398, 492.1–492.3

(56) References Cited

U.S. PATENT DOCUMENTS 4,942,342 A * 7/1990 Tsukakoshi ................. 315/410
4,983,850 A * 1/1991 Tsukakoshi et al. ..... 250/492.3
5,028,795 A * 7/1991 Sakurada et al. ........ 250/492.2
5,099,130 A * 3/1992 Aitken ................... 250/396 R
5,502,306 A * 3/1996 Meisburger et al. ........ 250/310
5,808,310 A * 9/1998 Yamashita et al. ..... 250/492.22
5,831,270 A * 11/1998 Nakasuji ............. 250/396 ML
5,838,112 A * 11/1998 Tsukakoshi et al. .... 315/111.81
6,028,317 A * 2/2000 Murooka et al. ...... 250/492.23
6,172,372 B1 * 1/2001 Vanderpot ............. 250/492.21
6,211,528 B1 * 4/2001 Tamura ................ 250/492.22
6,465,783 B1 * 10/2002 Nakasuji ..................... 250/311
6,495,841 B1 * 12/2002 Ando et al. ............ 250/492.23
6,630,681 B1 * 10/2003 Kojima .................. 250/492.22
2001/0010357 A1 * 8/2001 Ose et al. ................... 250/311
2002/0027204 A1 * 3/2002 Muto et al. ............. 250/492.3
2002/0038853 A1 * 4/2002 Hamaguchi et al. ..... 250/492.3
2002/0039829 A1 * 4/2002 Yasuda et al. .............. 438/463
2002/0151140 A1 * 10/2002 Nakasugi .................... 438/275
2003/0155522 A1 * 8/2003 Ooae et al. ............. 250/423 R
2003/0197135 A1 * 10/2003 Yamada ................ 250/492.23

FOREIGN PATENT DOCUMENTS

| | | |
|---|---|---|
| JP | 10-163089 | 6/1998 |
| JP | 11-260687 | 9/1999 |
| JP | 2000-077291 | 3/2000 |
| JP | 2002-015972 | 1/2002 |

* cited by examiner

*Primary Examiner*—John R. Lee
*Assistant Examiner*—Bernard E. Souw
(74) *Attorney, Agent, or Firm*—Morrison & Foerster LLP

(57) ABSTRACT

An electron beam exposure apparatus for exposing a wafer by an electron beam, including: an electron beam generation section for generating the electron beam; an electron beam shaping member with a plurality of openings for shaping the electron beam; a deflecting section for deflecting the electron beam which has passed through the electron beam shaping member; and a deflection correction control section for controlling the deflecting section based on a position of the opening of the electron beam shaping member through which the electron beam passes. The deflecting section deflects the electron beam and corrects distortion of an image of the electron beam on the wafer.

17 Claims, 7 Drawing Sheets

ELECTRON BEAM EXPOSURE APPARATUS, ELECTRON BEAM EXPOSURE METHOD, SEMICONDUCTOR DEVICE MANUFACTURING METHOD, AND ELECTRON BEAM SHAPE MEASURING METHOD

The present application is a continuation application of PCT/JP02/04676 filed on May 15, 2002, claiming priority from a Japanese patent application No. 2001-183478 filed on Jun. 18, 2001, the contents of which are incorporated herein by reference.

BACKGROUND OF THE INVENTION

1. Field of the Invention

The present invention relates to an electron beam exposure apparatus, an electron beam exposure method, a semiconductor device manufacturing method, and an electron beam shape measuring method.

2. Description of the Related Art

A conventional electron beam exposure apparatus includes an electron gun for generating an electron beam, a mask with a plurality of openings for shaping the electron beam, a first deflector for deflecting the electron beam to a predetermined opening of the mask, a second deflector for deflecting the electron beam deflected by the first deflector back to a predetermined position, an aperture with an opening through which the electron beam passes, a reducing lens for reducing a cross section of the electron beam, and a projection lens for projecting the electron beam, which has passed through the aperture, on a wafer. In the conventional electron beam exposure apparatus, a reduction ratio and rotation of a cross-sectional shape of the electron beam projected on the wafer are adjusted by adjusting power of the reducing lens and the projection lens.

However, in the conventional electron beam exposure apparatus, when the electron beam is shaped by an opening other than the opening positioned at the center of the mask, and the electron beam is reduced by the reducing glass at a portion other than the axis of the lens, there is a problem that the cross-sectional shape of the electron beam projected on the wafer is distorted.

SUMMARY OF THE INVENTION

Accordingly, it is an object of the present invention to provide an electron beam exposure apparatus, an electron beam exposure method, a semiconductor device manufacturing method, and an electron beam shape measuring method which can solve the foregoing problem. The object can be achieved by combinations described in the independent claims. The dependent claims define further advantageous and exemplary combinations of the present invention.

In order to solve the foregoing problem, according to the first aspect of the present invention, there is provided an electron beam exposure apparatus for exposing a wafer by an electron beam. The electron beam exposure apparatus includes: an electron beam generation section for generating the electron beam; an electron beam shaping member with a plurality of openings for shaping the electron beam; a deflecting section for deflecting the electron beam which has passed through the electron beam shaping member; and a deflection correction control section for controlling the deflecting section based on a position of the opening of the electron beam shaping member through which the electron beam passes. The deflecting section deflects the electron beam and corrects distortion of an image of the electron beam on the wafer.

The deflecting section is an eight poles electrostatic deflector may includes: a first deflecting electrode and an opposing second deflecting electrode; a seventh deflecting electrode and an opposing eighth deflecting electrode, which are disposed at an angle of 90 degrees on an axis of the deflecting section from the first deflecting electrode and the second deflecting electrode respectively; a third deflecting electrode and an opposing fourth deflecting electrode, which are disposed at an angle of 45 degrees on the axis of the deflecting section from the first deflecting electrode and the second deflecting electrode; and a fifth deflecting electrode and an opposing sixth deflecting electrode, which are disposed at an angle of 45 degrees on the axis of the deflecting section from each of the seventh deflecting electrode and the eighth deflecting electrode. The deflection correction control section may calculate deflecting electrode applied-voltage applied to each of the first deflecting electrode, the second deflecting electrode, the third deflecting electrode, the fourth deflecting electrode, the fifth deflecting electrode, the sixth deflecting electrode, the seventh deflecting electrode, and the eighth deflecting electrode, based on deflection data (X, Y) and correction data ($\alpha$, $\beta$) for correcting the distortion of the image of the electron beam on the wafer.

The deflection correction control section may calculate the deflecting electrode applied-voltage $V_1$, $V_2$, $V_7$, and $V_8$ applied to the first deflecting electrode, the second deflecting electrode, the seventh deflecting electrode, and the eighth deflecting electrode respectively based on the correction data a, and may calculate the deflecting electrode applied-voltage $V_3$, $V_4$, $V_5$, and $V_6$ applied to the third deflecting electrode, the fourth deflecting electrode, the fifth deflecting electrode, and the sixth deflecting electrode respectively based on the correction data $\beta$.

The deflection correction control section may calculate the deflecting electrode applied-voltage $V_1$, $V_2$, $V_3$, $V_4$, $V_5$, $V_6$, $V_7$, and $V_8$ using following equations.

$$V1=X\cdot c+Y\cdot s+\alpha$$

$$V2=-X\cdot c-Y\cdot s+\alpha$$

$$V3=X\cdot s+Y\cdot c+\beta$$

$$V4=-X\cdot s-Y\cdot c+\beta$$

$$V5=X\cdot c-Y\cdot s-\beta$$

$$V6=-X\cdot c+Y\cdot s-\beta$$

$$V7=X\cdot s-Y\cdot c-\alpha$$

$$V8=-X\cdot s+Y\cdot c-\alpha$$

Where constants c and s are defined according to geometrical relationship among the first deflecting electrode, the second deflecting electrode, the third deflecting electrode, the fourth deflecting electrode, the fifth deflecting electrode, the sixth deflecting electrode, the seventh deflecting electrode, the eighth deflecting electrode, and X, Y axes.

The deflecting section may deflect the electron beam which has passed through the electron beam shaping member so that the direction of the electron beam becomes substantially parallel with an optical axis of an electron beam which is not deflected by an electron optics system.

The electron beam exposure apparatus may further include a mask memory for storing correction data for correcting distortion of the image of the electron beam on the wafer in association with the position of the openings. The deflection correction control section may control the deflecting section based on the correction data stored in the mask memory.

The electron beam exposure apparatus may further include another deflecting section for deflecting the electron beam generated by the electron beam generation section to the position of the opening of the electron beam shaping member based on the deflection data stored in the mask memory.

According to the second aspect of the present invention, there is provided an electron beam exposure method for exposing a wafer by an electron beam. The electron beam exposure method includes steps of: generating the electron beam; shaping the electron beam by an electron beam shaping member with a plurality of openings for shaping the electron beam; correcting distortion of an image of the electron beam on the wafer and controlling the amount of deflection correction of the electron beam based on a position of the opening in the electron beam shaping member through which the electron beam passes; and deflecting and correcting the electron beam which has passed through the electron beam shaping member based on the amount of deflection correction, and exposing the wafer.

The electron beam exposure method may further include a step of measuring a cross-sectional shape of the electron beam, which has passed through the opening of the electron beam shaping member and is irradiated on the wafer. The deflecting and correcting step may include a step of controlling the amount of deflection correction of the electron beam based on the cross-sectional shape measured in the measurement step.

The measurement step may include steps of: shaping the electron beam into a first rectangle beam and a second rectangle beam where long sides of the first and second rectangle beams are substantially parallel with each other; scanning the first rectangle beam and the second rectangle beam to a direction substantially perpendicular to a direction of the long side of the first rectangle beam irradiated on the wafer, and irradiating the first rectangle beam and the second rectangle beam on a mark provided on the wafer; detecting the reflected electrons generated from the mark on which the first rectangle beam and the second rectangle beam are irradiated; processing the reflected electrons by measuring the cross-sectional shape of the first rectangle beam and the second rectangle beam irradiated on the wafer based on the reflected electrons which are detected; and calculating correction data for correcting distortion of an image of the electron beam irradiated on the wafer based on the position of the opening of the electron beam shaping member, which is based on a shape of the opening in which the electron beam is shaped in the electron beam shaping member and also based on the cross-sectional shape of the measured first rectangle beam and the second rectangle beam. The deflecting and correcting step controls the amount of deflection correction of the electron beam irradiated on the wafer based on the correction data.

The reflected electron processing step may further include a step of measuring a distance between the first rectangle beam and the second rectangle beam in a direction substantially perpendicular to the direction of the long side of the first rectangle beam irradiated on the wafer. The calculation step may calculate the correction data for correcting the distortion of the image of the electron beam irradiated on the wafer based on the distance between the first rectangle beam and the second rectangle beam.

The measurement electron beam shaping step may include a step of shaping the electron beam into the first rectangle beam, the second rectangle beam, a third rectangle beam, and a fourth rectangle beam, where long sides of the first and second rectangle beams are substantially parallel with each other and long sides of the third and fourth rectangle beams are substantially parallel with each other and the long sides of the first and third rectangle beams are substantially perpendicular to each other. The irradiation step may further include steps of scanning the first rectangle beam, the second rectangle beam, the third rectangle beam, and the fourth rectangle beam in a direction substantially perpendicular to the direction of the long side of the third rectangle beam irradiated on the wafer, and irradiating the first rectangle beam, the second rectangle beam, the third rectangle beam, and the fourth rectangle beam on the mark provided on the wafer. The detection step may include a step of detecting reflected electrons generated from the mark on which the first rectangle beam, the second rectangle beam, the third rectangle beam, and the fourth rectangle beam are irradiated. The reflected electron processing step may further include a step of measuring a distance between the third rectangle beams and the fourth rectangle beams in a direction substantially perpendicular to the direction of the long side of the third rectangle beam irradiated on the wafer based on the detected reflected electrons. The calculation step may calculate the correction data for correcting distortion of an image of the electron beam irradiated on the wafer based on the distance between the third rectangle beam and the fourth rectangle beam.

The measurement step may include: shaping the electron beam into a first rectangle beam and a second rectangle beam where long sides of the first and second rectangle beams are substantially parallel with each other; scanning the first rectangle beam and the second rectangle beam to a direction substantially perpendicular to a direction of the long side of the first rectangle beam irradiated on the wafer, and irradiating the first rectangle beam and the second rectangle beam on a mark provided on the wafer; detecting the reflected electrons generated from the mark on which the first rectangle beam and the second rectangle beam are irradiated; processing the reflected electrons by measuring the cross-sectional shape of the first rectangle beam and the second rectangle beam irradiated on the wafer based on the reflected electrons which are detected; and calculating correction data for correcting distortion of an image of the electron beam irradiated on the wafer based on the position of the opening of the electron beam shaping member, which is based on a shape of the opening in which the first rectangle beam and the second rectangle beam are shaped in the electron beam shaping member and also based on the cross-sectional shape of the measured first rectangle beam and the second rectangle beam. The deflecting and correcting step may control the amount of the deflection correction of the electron beam irradiated on the wafer based on the correction data.

The reflected electron processing step may further include a step of measuring an angle between a direction of a long side of the first rectangle beam irradiated on the wafer and a direction of a long side of the second rectangle beam irradiated on the wafer make. The calculation step may calculate the correction data for correcting distortion of an image of the electron beam irradiated on the wafer based on the angle between the direction of the long side of the first rectangle beam and the direction of the long side of the second rectangle beam.

According to the third aspect of the present invention, there is provided a semiconductor device manufacturing method of exposing a wafer by an electron beam and manufacturing a semiconductor device. The semiconductor device manufacturing method includes steps of: generating the electron beam; shaping the electron beam by an electron beam shaping member with a plurality of openings for shaping the electron beam; correcting distortion of an image of the electron beam on the wafer and, controlling the amount of deflection correction of the electron beam based on a position of the opening in the electron beam shaping member through which the electron beam passes; and deflecting and correcting the electron beam which has passed through the electron beam shaping member based on the amount of deflection correction, and exposing the wafer.

According to the fourth aspect of the present invention, there is provided an electron beam shape measuring method of measuring a cross-sectional shape of an electron beam. The electron beam shape measuring method includes steps of: generating the electron beam; shaping the cross-sectional shape of the electron beam; scanning the electron beam and irradiating the electron beam on a mark; and measuring the cross-sectional shape of the electron beam based on the electron beam irradiated on the mark.

The electron beam shape measuring method may further include a step of detecting the reflected electrons generated from the mark on which the electron beam is irradiated. The shape measurement step may measure the cross-sectional shape of the electron beam based on the detected reflected electrons.

This summary of invention does not necessarily describe all necessary features so that the invention may also be a sub-combination of these described features.

DETAILED DESCRIPTION OF THE INVENTION

The invention will now be described based on the embodiments hereinafter, which do not intend to limit the scope of the present invention as defined in the appended claims. All of the features and the combinations thereof described in the embodiments are not necessarily essential to the invention.

Figure 1:
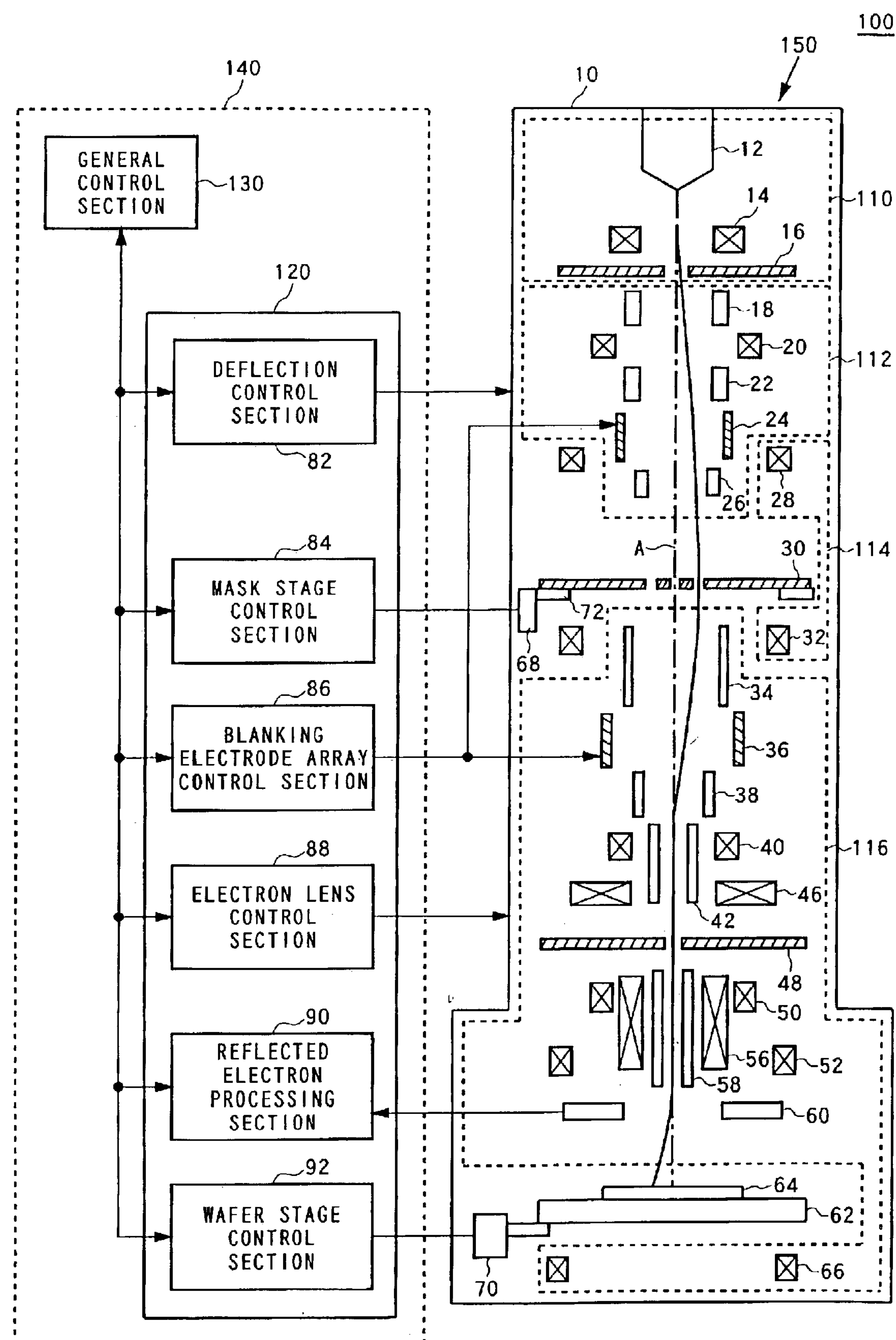
FIG. 1 is a schematic diagram showing a configuration of an electron beam exposure apparatus according to an embodiment of the present invention.

FIG. 1 is a block diagram of an electron beam exposure apparatus 100 according to an embodiment of the present invention. The electron beam exposure apparatus 100 includes an exposure section 150 for performing a predetermined exposure processing on a wafer 64 by an electron beam, and a control system 140 for controlling operation of each component of the exposure section 150.

The exposure section 150 includes an electron optics system, which includes: an electron beam irradiation system 110 for irradiating a predetermined electron beam into a case 10; a mask projection system 112 for deflecting the electron beam irradiated from the electron beam irradiation system 110, and for adjusting an image focus location of the electron beam in the vicinity of a mask 30; a focal point adjustment lens system 114 for adjusting the image focus location of the electron beam in the vicinity of the mask 30; and a wafer projection system 116 for deflecting the electron beam, which has passed through the mask 30, to a predetermined area on the wafer 64 mounted on a wafer stage 62, and for adjusting a direction and a size of an image of a pattern which is exposed on the wafer 64.

Moreover, the exposure section 150 includes a stage system which includes: a mask stage 72 on which the mask 30 is mounted, where the mask 30 includes a plurality of opening patterns which are shaped into shapes which are to be exposed on the wafer 64; a mask stage drive section 68 for driving the mask stage 72; a wafer stage 62 on which the wafer 64 is mounted, where the patterns are to be exposed on the wafer; and a wafer stage drive section 70 for driving the wafer stage 62. Furthermore, the exposure section 150 includes a reflected electron detector 60 for detecting electrons scattered from a side of the wafer stage 62 for adjustment of the electron optics system, and converting the amount of scattered electrons into a corresponding electrical signal.

The electron beam irradiation system 110 includes a first electron lens 14 for determining a focal point position of the electron beam generated by the electron gun 12, which is an example of the electron beam generating section for generating an electron beam, and a slit section 16 with an opening (slit) having a rectangle shape through which the electron beam passes. Since it takes a predetermined time for the electron gun 12 to generate the electron beam stably, the electron gun 12 may generate the electron beam consecutively during a period of the exposure processing. It is preferable that the slit is formed according to the shape of the predetermined opening pattern formed in the mask 30. An alternate long and short dash line A in FIG. 1 indicates an optical axis of the electron beam irradiated from the electron beam irradiation system 110, in a case where the electron beam is not deflected by the electron optics system.

The mask projection system 112 includes: a first deflector 18, a second deflector 22, and a third deflector 26 as a deflecting system for deflecting the electron beam; a second electron lens 20 as a focus system for adjusting a focal point of the electron beam; and a first blanking electrode 24. The first deflector 18 and the second deflector 22 deflect the electron beam to a predetermined area on the mask 30. For example, the predetermined area is an opening pattern including a pattern which is to be exposed on the wafer 64. When the electron beam passes through the pattern, a cross-sectional shape of the electron beam becomes the shape of the pattern. Here, the image of the electron beam which has passed through the predetermined opening pattern is defined as the pattern image. The third deflector 26 deflects an orbit of the electron beam which has passed through the first deflector 18 and the second deflector 22 to a direction substantially parallel with the optical axis A. The second electron lens 20 includes a function for focusing the image of the opening of the slit section 16 on the mask 30 mounted on the mask stage 72, in cooperation with the electron lens 28.

The first blanking electrode 24 deflects the electron beam so that the electron beam does not hit the opening pattern of the mask 30. It is preferable that the first blanking electrode 24 deflects the electron beam so that the electron beam does not hit the mask 30. Since the pattern of the mask 30 is deteriorated when the electron beam is irradiated consecutively, the first blanking electrode 24 deflects the electron beam when the pattern is not exposed on the wafer 64, so that the deterioration of the mask 30 is prevented. The focal point adjustment lens system 114 includes a third electron lens 28 and a fourth electron lens 32. The third electron lens 28 and the fourth electron lens 32 determine the image formation conditions of the electron beam which has passed thorough the mask 30. The wafer projection system 116 includes a fifth electron lens 40, a sixth electron lens 46, a seventh electron lens 50, an eighth electron lens 52, a ninth electron lens 66, a fourth deflector 34, a fifth deflector 38, a sixth deflector 42, a main deflector 56, a sub deflector 58, a second blanking electrode 36, and a round aperture section 48.

The pattern image is rotated due to influence of an electric field and/or a magnetic field. The fifth electron lens 40 adjusts rotation of the pattern image of the electron beam which has passed through the predetermined opening pattern of the mask 30. The sixth electron lens 46 and the seventh electron lens 50 adjust the reduction ratio of the pattern image exposed on the wafer 64 to the pattern formed on the mask 30. The eighth electron lens 52 and the ninth electron lens 66 function as an objective lens. The fourth deflector 34 and the sixth deflector 42 deflect the electron beam to the direction of the optical axis A at a downstream of the mask 30 in the irradiation direction of the electron beam. The fifth deflector 38 deflects the electron beam to a direction substantially parallel with the optical axis A. The main deflector 56 and the sub deflector 58 deflect the electron beam so that the electron beam is irradiated on the predetermined area of the wafer 64. In the present embodiment, the main deflector 56 is used for deflecting the electron beam in a subfield including a plurality of areas which can be irradiated by single shot of the electron beam (to be referred to as shot area hereinafter), and the sub deflector 58 is used for the deflection between the shot areas in the subfield.

The round aperture section 48 includes a circular opening (round aperture). The second blanking electrode 36 deflects the electron beam so that it hits outside of the round aperture. Therefore, the second blanking electrode 36 prevents the electron beam from going to the downstream of the round aperture section 48 in the irradiation direction of the electron beam. Since the electron gun 12 consecutively irradiates the electron beam during the period of the exposure processing, it is preferable that the second blanking electrode 36 deflects the electron beam so that the electron beam does not go to the downstream of the round aperture section 48, when changing the patterns to be exposed on the wafer 64, or when changing the areas in the wafer 64 on which the pattern is to be exposed.

The control system 140 includes a general control section 130 and an individual control section 120. The individual control section 120 includes a deflecting control section 82, a mask stage control section 84, a blanking-electrode control section 86, an electron lens control section 88, a reflected electron processing section 90, and a wafer stage control section 92, which are examples of a deflection correction control section. For example, the general control section 130 is a work station, and collectively controls each control section of the individual control section 120. The deflecting control section 82 supplies the deflection data indicating the amount of deflection to the first deflector 18, the second deflector 22, the third deflector 26, the fourth deflector 34, the fifth deflector 38, the sixth deflector 42, the main deflector 56, and the sub deflector 58, and controls the amount of the deflection correction of the first deflector 18, the second deflector 22, the third deflector 26, the fourth deflector 34, the fifth deflector 38, the sixth deflector 42, the main deflector 56, and the sub deflector 58. Alternatively, based on the position of the opening pattern through which the electron beam passed in the mask 30, the deflecting control section 82 corrects distortion of the image of the electron beam on the wafer, and controls the amount of the deflection correction of the first deflector 18, the second deflector 22, the third deflector 26, the fourth deflector 34, the fifth deflector 38, and the sixth deflector 42. The mask stage control section 84 controls the mask stage drive section 68, and moves the mask stage 72.

The blanking electrode control section 86 controls the first blanking electrode 24 and the second blanking electrode 36. In the present embodiment, it is preferable that the first blanking electrode 24 and the second blanking electrode 36 are controlled so that the electron beam is to be irradiated on the wafer 64 at the period of the exposure processing, and the electron beam is not irradiated on the wafer 64 expect the period of the exposure processing. The electron lens control section 88 controls electric power supplied to the first electron lens 14, the second electron lens 20, the third electron lens 28, the fourth electron lens 32, the fifth electron lens 40, the sixth electron lens 46, the seventh electron lens 50, the eighth electron lens 52, and the ninth electron lens 66. The reflected electron processing section 90 detects digital data indicating the amount of electrons based on an electrical signal detected by the reflected electron detector 60. The wafer stage control section 92 moves the wafer stage 62 to a predetermined position by the wafer stage drive section 70.

Here, operation of the electron beam exposure apparatus 100 according to the present embodiment will be explained hereinafter. The mask 30, which includes a plurality of opening patterns each of which is shaped in a predetermined pattern, is mounted on the mask stage 72, and the mask 30 is fixed to a predetermined position. The mask 30 is an example of an electron beam shaping member, and the opening pattern is an example of an opening. Moreover, the wafer 64, on which the exposure processing is performed, is mounted on the wafer stage 62. The wafer stage control section 92 causes the wafer stage drive section 70 to moves the wafer stage 62 so that the area to be exposed on the wafer 64 is located in the vicinity of the optical axis A. Moreover, since the electron gun 12 irradiates the electron beam consecutively during the period of the exposure processing, the blanking-electrode control section 86 controls the first blanking electrode 24 and the second blanking electrode 36 so that the electron beam which has passed through the opening of the slit section 16 is not irradiated on the mask 30 and the wafer 64 before the exposure processing. In the mask projection system 112, the electron lens 20 and the deflectors (18, 22, 26) are adjusted so that the electron beam is irradiated to the opening pattern having a shape which is to be exposed on the wafer 64. In the focal point adjustment lens system 114, the electron lenses (28, 32) are adjusted so that a predetermined image formation condition is satisfied at the downstream of the mask 30. Moreover, in the wafer projection system 116, the electron lenses (40, 46, 50, 52, 66) and the deflector (34, 38, 42, 56, 58) are adjusted so that the pattern image is exposed on a predetermined area of the wafer 64.

After the adjustment of the mask projection system 112 is completed, the focal point adjustment lens system 114, and the wafer projection system 116, the blanking-electrode control section 86 causes the first blanking electrode 24 and the second blanking electrode 36 to stop the deflection of the electron beam. Thereby, as explained hereinafter, the electron beam is irradiated on the wafer 64 through the mask 30. The electron gun 12 generates the electron beam, and the first electron lens 14 adjusts the focal point of the electron beam, so that it is irradiated on the slit section 16. Then, the first deflector 18 and the second deflector 22 deflect the electron beam which has passed through the slit section 16 so that it is irradiated on a predetermined area on the mask 30 at which the pattern to be exposed is formed. The electron beam, which has passed through the opening of the slit section 16, has a rectangular cross-sectional shape. The third deflector 26 deflects the electron beam which has been deflected by the first deflector 18 and the second deflector 22 so that the direction of the electron beam becomes substantially parallel with the optical axis A. Moreover, the electron beam is adjusted by the second electron lens 20 so that the image of the opening of the slit section 16 is focused on a predetermined area of the mask 30.

Then, the electron beam which has passed through the pattern formed in the mask 30 is deflected in the direction toward the optical axis A by the fourth deflector 34 and the sixth deflector 42. The electron beam is further deflected by the fifth deflector 38 so that a direction of the electron beam becomes substantially parallel with the optical axis A. Moreover, based on the deflection data from the deflecting control section 120, the fifth deflector 38 deflects the electron beam and corrects distortion of the image of the electron beam on the wafer. Moreover, the third electron lens 28 and the fourth electron lens 32 adjust the electron beam so that the image of the pattern formed in the mask 30 is focused on the surface of the wafer 64. The rotation of the pattern image of the electron beam is adjusted by the fifth electron lens 40. The reduction ratio of the pattern image is adjusted by the sixth electron lens 46 and the seventh electron lens 50. Then the electron beam is deflected by the main deflector 56 and the sub deflector 58 so that it is irradiated on a predetermined shot area of the wafer 64. In the present embodiment, the main deflector 56 deflects the electron beam in a subfield including a plurality of shot areas, and the sub deflector 58 deflects the electron beam between the shot areas in the subfield. The electron beam deflected to the predetermined shot area is adjusted and irradiated on the wafer 64 by the electron lens 52 and the electron lens 66. In this way, the image of the pattern formed by the mask 30 is exposed on the predetermined shot area on the wafer 64.

After a predetermined exposure time has elapsed, the blanking-electrode control section 86 controls the first blanking electrode 24 and the second blanking electrode 36 to deflect the electron beam so that the electron beam is not irradiated on the mask 30 and the wafer 64. The pattern formed at the mask 30 is exposed on the predetermined shot area of the wafer 64 by the process described above. In order to expose the pattern formed at the mask 30 on a second shot area, the electron lens 20 and the deflectors (18, 22, 26) are adjusted so that the electron beam is irradiated to the opening pattern having a pattern which is to be exposed on the wafer 64 in the mask projection system 112. Moreover, in the wafer projection system 116, the electron lenses (40, 46, 50, 52, 66) and the deflectors (34, 38, 42, 56, 58) are adjusted so that the pattern image is exposed on the predetermined area of the wafer 64.

Specifically, the sub deflector 58 adjusts an electric field so that the pattern image generated by the mask projection system 112 is exposed on the second shot area. Then, the pattern is exposed on the shot area in the same manner as described above. After exposing a pattern to all shot areas which are to be exposed in the subfield, the main deflector 56 adjusts a magnetic field so that a pattern is exposed on a second subfield. The electron beam exposure apparatus 100 repeats this exposure processing so that a desired circuit pattern is exposed on the wafer 64.

The electron beam exposure apparatus 100, which is an electron beam processing apparatus according to the present invention, may be an electron beam exposure apparatus using a variable rectangle.

Figure 2:
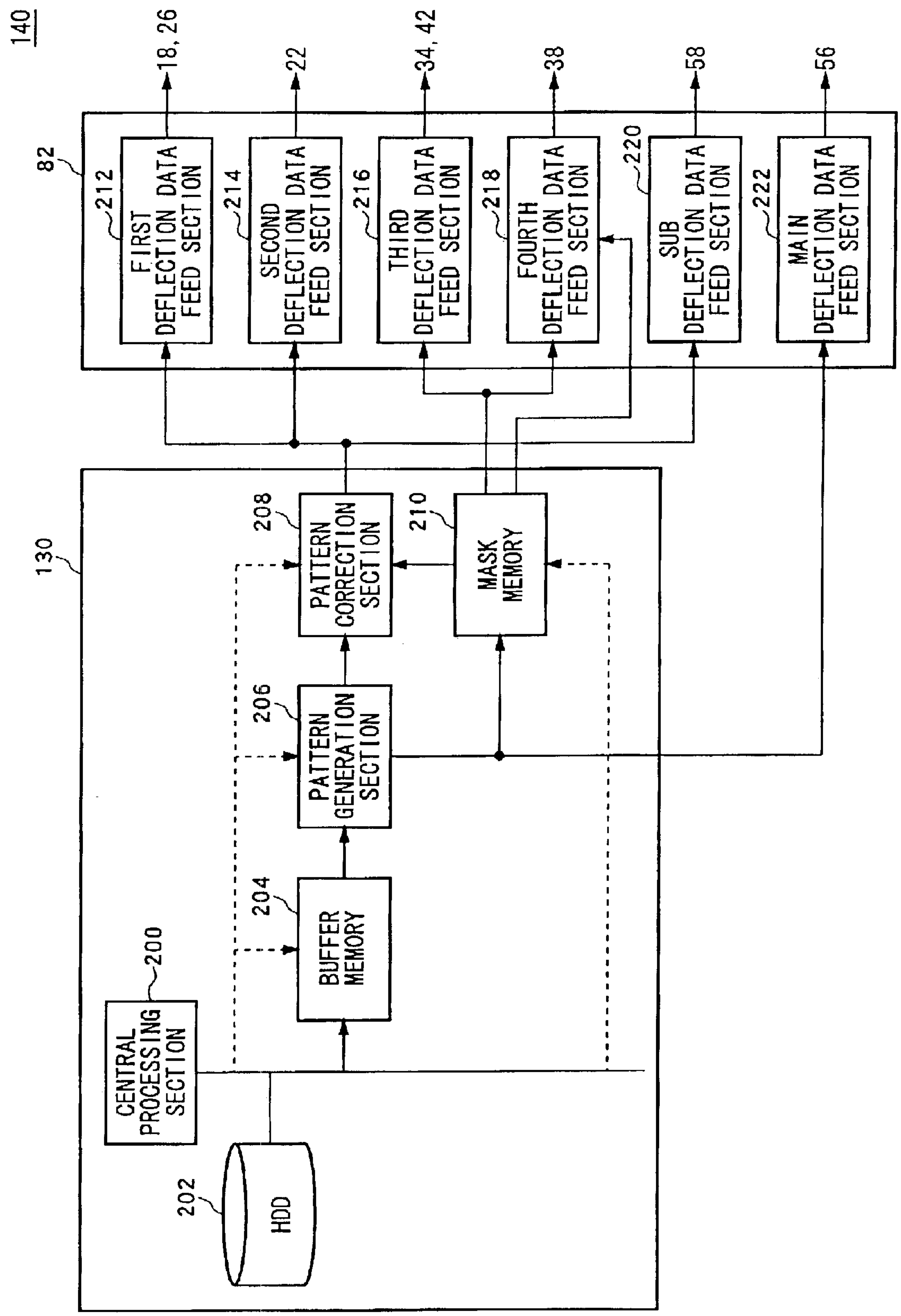
FIG. 2 is a block diagram showing a configuration of a control system according to the present embodiment.

FIG. 2 is a block diagram of the control system 140 according to the present embodiment. The general control section 130 includes: a central processing section 200 for controlling the general control section 130; hard disk drive (HDD) 202 for storing exposure data of the pattern which is to be exposed on the wafer; a buffer memory 204 for storing the exposure data temporarily; a pattern generation section 206 for generating shot data, which is output from the buffer memory 204 and divided into each shot; a pattern correction section 208 for performing correction processing to the shot data generated by the pattern generation section 206; and a mask memory 210 for storing a position of the opening pattern of the mask 30 and the deflection data, which are associated with each other. Moreover, the mask memory 210 according to the present embodiment stores correction data for adjusting the distortion of the electron beam image on the wafer in association with the position of the opening pattern.

Moreover, the deflecting control section 82 includes: a first deflection data supplying section 212 for feeding the deflection data to the first deflector 18 and the third deflector 26; a second deflection data supplying section 214 for feeding the deflection data to the second deflector 22; a third deflection data supplying section 216 for feeding the deflection data to the fourth deflector 34 and the sixth deflector 42; a fourth deflection data supplying section 218 for feeding deflection data to the fifth deflector; a sub deflection data supplying section 220 for feeding the deflection data to the sub deflector 58; and a main deflection data supplying section 222 for feeding deflection data to the main deflector 56.

The central processing section 200 reads desired exposure data from the hard disk drive 202, and supplies them to the buffer memory 204. Then, the buffer memory 204 stores temporarily the exposure data output from the hard disk drive 204. Then, the central processing section 200 supplies an address, in which the exposure data of the exposure pattern to be exposed are stored, to the buffer memory 204. Then, the buffer memory 204 supplies the exposure data corresponding to the address received from the central processing section 200 to the pattern generation section 206.

Next, the pattern generation section 206 generates the shot data which is output from the buffer memory 204 and divided into each shot. Then, the pattern generation section 206 supplies the deflection data, which are to be fed to the main deflector 56, to the main deflection data supplying section 222 based on the generated shot data. Moreover, the pattern generation section 206 supplies the pattern data code to the mask memory 210 based on the generated shot data, where the pattern data code indicates which opening pattern among the opening patterns included in the mask 30 is to be used for the exposure processing. Then, the mask memory 210 generates the deflection data which are to be fed to each of the first deflector 18, the second deflector 22, the third deflector 26, the fourth deflector 34, the fifth deflector 38, and the sixth deflector 42 based on the pattern data code received from the pattern generation section 206. Moreover, the mask memory 210 generates the correction data, which is stored in association with the position of the opening pattern, for correcting the distortion of the electron beam image on the wafer based on the pattern data code received from the pattern generation section 206.

First, the mask memory 210 supplies the deflection data to the pattern correction section 208, where the deflection data are to be fed to the first deflector 18, the second deflector 22, the third deflector 26, and the sub deflector 58. Then, the pattern correction section 208 performs correction processing to the deflection data received from the mask memory 210, and supplies the corrected deflection data to the first deflection data supplying section 212, the second deflection data supplying section 214, and the sub deflection data supplying section 220. Then, the first deflection data supplying section supplies the deflection data received from the pattern correction section 208 to the first deflector 18 and the third deflector 26. Moreover, the second deflection data supplying section supplies the deflection data received from the pattern data correction section 208 to the second deflector 22. Moreover, the sub deflection data supplying section 220 supplies the deflection data received from the pattern correction section 208 to the sub deflector 58. Then, the first deflector 18, the second deflector 22, the third deflector 26, and the sub deflector 58 deflect the electron beam based on the received deflection data.

Moreover, the mask memory 210 supplies the deflection data, which are to be fed to the fourth deflector 34, the fifth deflector 38, and the sixth deflector 42, to each of the third deflection data supplying section 216 and the fourth deflection data supplying section 218. Moreover, the mask memory 210 supplies the correction data, which are to be fed to the fifth deflector 38, to the fourth deflection data supplying section. Then, the third deflection data supplying section 216 supplies the deflection data received from the mask memory 210 to the fourth deflector 34 and the sixth deflector 42. Moreover, the fourth deflection data supplying section 218 supplies the deflection data and the correction data, which are received from the mask memory 210, to the fifth deflector 38. Then, the fourth deflector 34 and the sixth deflector 42 deflect the electron beam based on the received deflection data. Moreover, based on the received deflection data and the correction data, the fifth deflector 38 deflects the electron beam and adjusts distortion of the image of the electron beam on the wafer.

Alternatively, the mask memory 210 supplies the correction data for correcting the distortion of the image of the electron beam on the wafer, which are to be fed to the second deflector 22, to the second deflection data supplying section 214. Then, the second deflection data supplying section 214 supplies the correction data received from the mask memory 210 to the second deflector 22. Then, the second deflector 22 deflects the electron beam generated by the electron gun 12 to the position of the desired opening pattern in the mask 30 based on the correction data received from the second deflection data supplying section 214. Moreover, the mask memory 210 supplies the correction data, which corrects the distortion of the image of the electron beam on the wafer, to the first deflection data supplying section 212, the second deflection data supplying section 214, and the third deflection data supplying section 216.

Figure 3B:
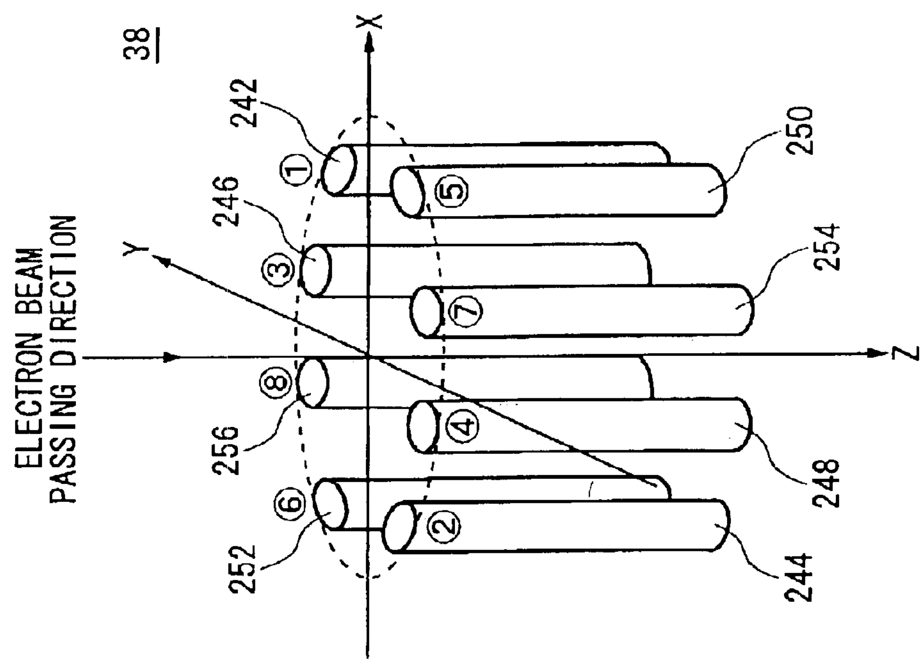
FIGS. 3A and 3B are schematic diagrams showing a configuration of a fourth deflection data supplying section and a fifth deflector according to the present embodiment.
Figure 3A:
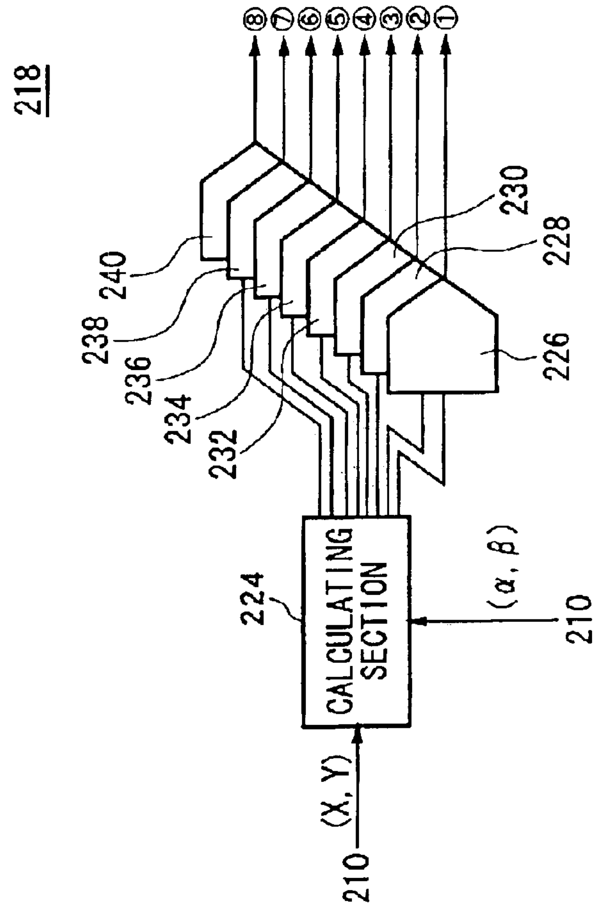

FIG. 3 is a block diagram of the fourth deflection data supplying section 218 and the fifth deflector 38 according to the present embodiment. As shown in FIG. 3A, the fourth deflection data supplying section 218 includes a calculating section 224, a first output section 226, a second output section 228, a third output section 230, a fourth output section 232, a fifth output section 234, a sixth output section 236, a seventh output section 238, and an eighth output section 240. Moreover, as shown in FIG. 3B, the fifth deflector 38 is an eight poles electro static deflector including a first deflecting electrode 242, a second deflecting electrode 244, a third deflecting electrode 246, a fourth deflecting electrode 248, a fifth deflecting electrode 250, a sixth deflecting electrode 252, a seventh deflecting electrode 254, and an eighth deflecting electrode 256.

The calculating section 224 calculates a deflecting electrode applied-voltage applied to each of the first deflecting electrode 242, the second deflecting electrode 244, the third deflecting electrode 246, the fourth deflecting electrode 248, the fifth deflecting electrode 250, the sixth deflecting electrode 252, the seventh deflecting electrode 254, and the eighth deflecting electrode 256 based on the deflection data (X, Y) received from the mask memory 210, and the correction data (α, β). Specifically, a deflecting electrode applied-voltage $V_1$ applied to the first deflecting electrode 242, a deflecting electrode applied-voltage $V_2$ applied to the second deflecting electrode 244, a deflecting electrode applied-voltage $V_3$ applied to the third deflecting electrode 246, a deflecting electrode applied-voltage $V_4$ applied to the fourth deflecting electrode 248, a deflecting electrode applied-voltage $V_5$ applied to the fifth deflecting electrode 250, a deflecting electrode applied-voltage $V_6$ applied to the sixth deflecting electrode 252, a deflecting electrode applied-voltage $V_7$ applied to the seventh deflecting electrode 254, and a deflecting electrode applied-voltage $V_8$ applied to the eighth deflecting electrode 256, are calculated by following equations.

$$V_1 = X \cdot c + Y \cdot s + \alpha$$

$$V_2 = -X \cdot c - Y \cdot s + \alpha$$

$$V_3 = X \cdot s + Y \cdot c + \beta$$

$$V_4 = -X \cdot s - Y \cdot c + \beta$$

$$V_5 = X \cdot c - Y \cdot s - \beta$$

$$V_6 = -X \cdot c + Y \cdot s - \beta$$

$$V_7 = X \cdot s - Y \cdot c - \alpha$$

$$V_8 = -X \cdot s + Y \cdot c - \alpha$$

Where, c and s are constants defined according to geometrical relationship among the first deflecting electrode 242, the second deflecting electrode 244, the third deflecting electrode 246, the fourth deflecting electrode 248, the fifth deflecting electrode 250, the sixth deflecting electrode 252, the seventh deflecting electrode 254, the eighth deflecting electrode 256, and X, Y axes.

The calculating section 224 calculates the deflecting electrode applied-voltage $V_1$ and $V_2$ applied to each of the first deflecting electrode 242 and the opposing second deflecting electrode 244 based on the correction data α. Moreover, the calculating section 224 calculates the deflecting electrode applied-voltage $V_7$ and $V_8$ applied to each of the seventh deflecting electrode 254 and the eighth deflecting electrode 256 based on the correction data α, where each of the seventh deflecting electrode 254 and the eighth deflecting electrode 256 are disposed at an angle of 90 degrees on the axis of the fifth deflector 38 from each of the first deflecting electrode 242 and the second deflecting electrode 244. Moreover, the calculating section 224 calculates the deflecting electrode applied-voltage $V_3$ and $V_4$ applied to each of the third deflecting electrode 246 and the fourth deflecting electrode 248 based on the correction data β, where each of the third deflecting electrode 246 and the fourth deflecting electrode 248 are disposed at an angle of 45 degrees on the axis of the fifth deflector 38 from each of the first deflecting electrode 242 and the second deflecting electrode 244. Moreover, the calculating section 224 calculates the deflecting electrode applied-voltage $V_5$ and $V_6$ applied to each of the fifth deflecting electrode 250 and the sixth deflecting electrode 252 based on the correction data β, where each of-the fifth deflecting electrode 250 and the sixth deflecting electrode 252 are disposed at an angle of 45 degrees on the axis of the fifth deflector 38 from each of the seventh deflecting electrode 254 and the eighth deflecting electrode 256.

Then, the first output section 226 supplies the deflecting electrode applied-voltage $V_1$ to the first deflecting electrode 242. Moreover, the second output section 228 supplies the deflecting electrode applied-voltage $V_2$ to the second deflecting electrode 244. Moreover, the third output section 230 supplies the deflecting electrode applied-voltage $V_3$ to the third deflecting electrode 246. Moreover, the fourth output section 232 supplies the deflecting electrode applied-voltage $V_4$ to the fourth deflecting electrode 248. Moreover, the fifth output section 234 supplies the deflecting electrode applied-voltage $V_5$ to the fifth deflecting electrode 250. Moreover, the sixth output section 236 supplies the deflecting electrode applied-voltage $V_6$ to the sixth deflecting electrode 252. Moreover, the seventh output section 238 supplies the deflecting electrode applied-voltage $V_7$ to the seventh deflecting electrode 254. Moreover, the eighth output section 240 supplies the deflecting electrode applied-voltage $V_8$ to the eighth deflecting electrode 256.

Then, each of the first deflecting electrode 242, the second deflecting electrode 244, the third deflecting electrode 246, the fourth deflecting electrode 248, the fifth deflecting electrode 250, the sixth deflecting electrode 252, the seventh deflecting electrode 254, and the eighth deflecting electrode 256 deflects the electron beam and corrects the distortion of the image of the electron beam on a wafer based on each of the deflecting electrode applied-voltage $V_1$, $V_2$, $V_3$, $V_4$, $V_5$, $V_6$, $V_7$, and $V_8$.

The electron beam exposure apparatus 100 according to the present embodiment corrects distortion of the image of the electron beam appropriately by calculating the deflecting electrode applied-voltage applied to the first deflecting electrode 242, the second deflecting electrode 244, the third deflecting electrode 246, the fourth deflecting electrode 248, the fifth deflecting electrode 250, the sixth deflecting electrode 252, the seventh deflecting electrode 254, and the eighth deflecting electrode 256 using a plurality of correction data.

Moreover, according to the electron beam exposure apparatus 100 of the present embodiment, the deflecting control section 82 supplies the deflecting electrode applied-voltage, which is calculated based on the deflection data and the correction data, to the fifth deflector 38, and the fifth deflector 38 deflects the electron beam and corrects the distortion of the image of the electron beam on the wafer based on the deflecting electrode applied-voltage. Therefore, the fifth deflector 38 of the electron beam exposure apparatus 100 according to the present embodiment deflects the electron beam and corrects the distortion of the image of the electron beam on the wafer without additional deflector, coil or the like for correcting the distortion of the image of the electron beam on the wafer.

Moreover, the electron beam exposure apparatus 100 according to the present embodiment includes a mask memory 210 for storing the correction data in association with the position of the opening pattern in the mask 30, where the correction data corrects the distortion of the image of the electron beam on the wafer, so that the fifth deflector 38 deflects the electron beam based on the correction data, and the distortion of the image of the electron beam irradiated on the wafer is corrected. As a result, the electron beam exposure apparatus 100 according to the present embodiment exposes a pattern on the wafer accurately.

Figure 4:
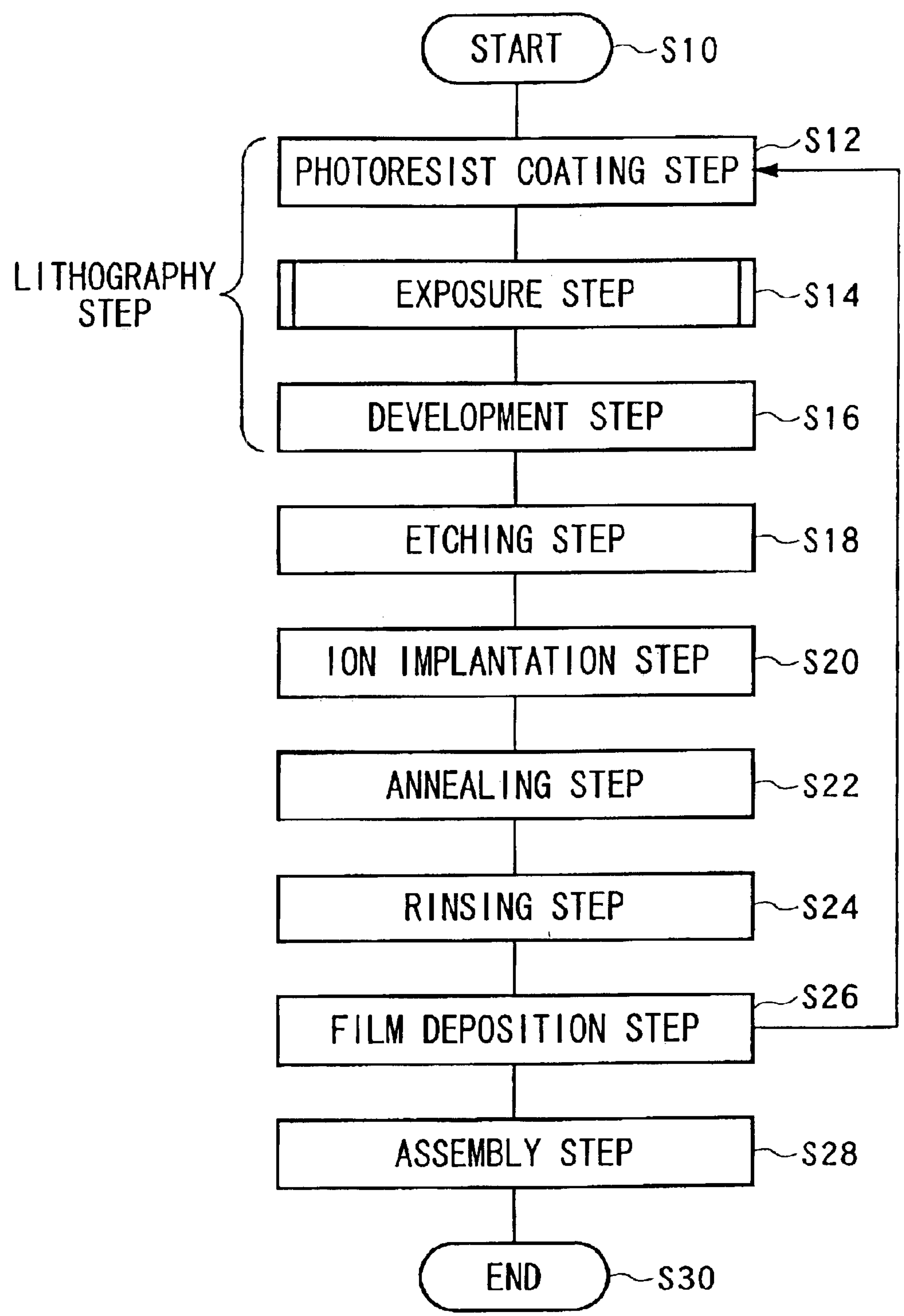
FIG. 4 is a flow chart of a semiconductor device manufacturing process for manufacturing semiconductor devices from a wafer.

FIG. 4 is a flow chart of a semiconductor manufacturing method of manufacturing a semiconductor device from a wafer. This flow chart begins from S10. In a photoresist coating step, photoresist is coated on the upper surface of the wafer (S12). Then, the wafer, on which the photoresist is coated, is mounted on the wafer stage 62 of the electron beam exposure apparatus 100 shown in FIG. 1. In an exposure step, a pattern image is exposed on the wafer by the electron beam which has passed through the mask 30, as explained in reference with FIG. 1 (S14).

Next, in a development step, the exposed wafer is dipped in developer, developed, and excessive resist is removed (S16). Then, in an etching step, the silicon substrate, insulator layer, or electric conduction film, which is in the area where the photoresist on the wafer is removed, is etched by anisotropic etching using plasma (S18). Then, in an ion implantation step, impurity, such as boron and arsenic, is poured into the wafer to form semiconductor devices, such as transistors and diodes (S20). Then, in an annealing step, the wafer is annealed and the poured impurity is activated (S22). Then, in a rinsing step, the wafer is rinsed with chemical to remove the organic contamination and/or metal contamination on the wafer (S24). Then, in a film deposition step, a conductive layer or an insulator layer is deposited, and a wiring layer and an insulating layer between the wirings are formed (S26). The semiconductor device, which includes an isolation area, an element area, and a wiring layer on the wafer, is manufactured by combining and repeating steps from the photoresist coating step (S12) to the film deposition step (S26). Then, in an assembly step, the wafer, in which a predetermined circuit is formed, is sliced, ant the chip is assembled (S28). The semiconductor device manufacturing flow is halted in S30.

Figure 5:
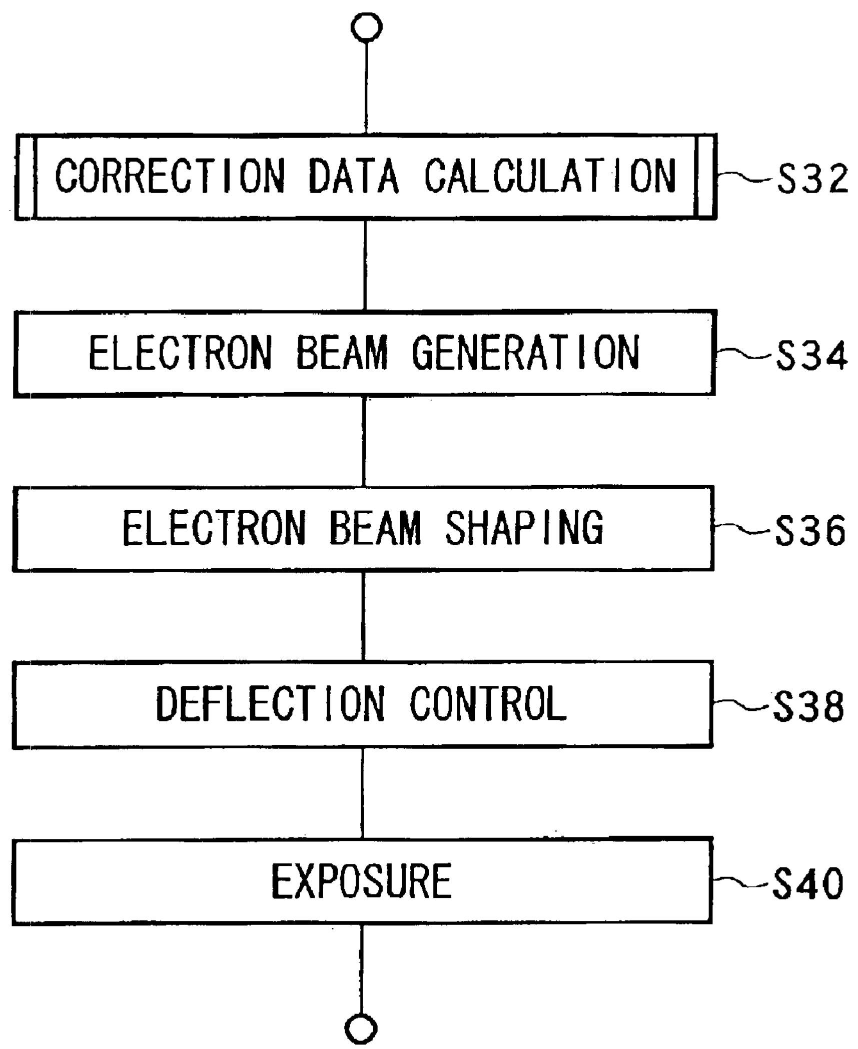
FIG. 5 is a flow chart of an exposure step of exposing a pattern on the wafer.

FIG. 5 is a flow chart of the exposure step (S14) of exposing a pattern image on the wafer. First, the electron beam exposure apparatus 100 measures a cross-sectional shape of the electron beam irradiated on the wafer which passes through the opening pattern of the mask 30. Then, based on the shape of the opening pattern through which the electron beam has passed and the cross-sectional shape of the measured electron beam, the correction data, for correcting the distortion of the image of the electron beam irradiated on the wafer, are calculated (S32). Then, the mask memory 210 stores the calculated correction data in association with the position of the opening pattern through which the electron beam has passed.

Next, the electron gun 12 generates the electron beam (S34) Then, the mask 30 shapes the cross-sectional shape of the electron beam generated by the electron gun 12 into a desired shape (S34). Then, based on the position of the opening pattern of the mask 30 through which the electron beam has passed, the deflecting control section 82 corrects the distortion of the image of the electron beam on the wafer, and controls the amount of the deflection correction of the electron beam by the fifth deflector 38 (S38). Then, the fifth deflector 38 deflects the electron beam which has passed through the mask 30 based on the amount of the deflection correction directed from the deflecting control section 38.

Then, the pattern is exposed on the wafer by the electron beam deflected by the fifth deflector 38 (S40).

According to the electron beam exposure method according to the present embodiment, since the correction data, for correcting the distortion of the image of the electron beam on the wafer based on the position of the plurality of opening patterns in the mask 30, is calculated before starting the exposure processing, the distortion of the image of the electron beam on the wafer is corrected accurately in the exposure processing. As a result, according to the electron beam exposure method according to the present embodiment, the pattern is exposed on the wafer accurately.

Figure 6:
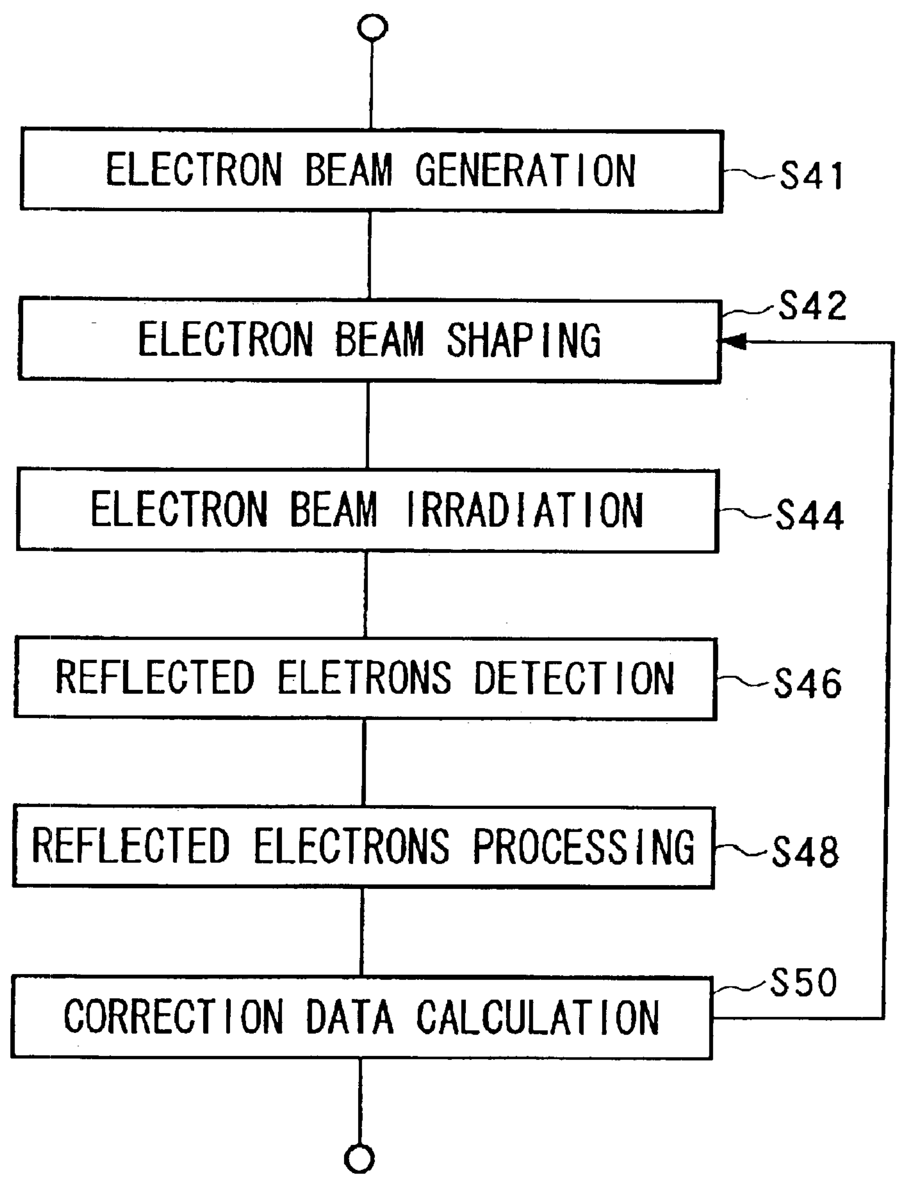
FIG. 6 is a flow chart of a correction data calculation step of calculating correction data for correcting distortion of an image of the electron beam.

FIG. 6 is a flow chart of the correction data calculating step (S32) of calculating the correction data for correcting the distortion of the image of the electron beam. Moreover, FIG. 7 is a figure explaining an electron beam irradiation step (S44) and a reflected electron processing step (S48). Hereinafter, the explanation will be done with reference with FIGS. 6 and 7.

First, the electron gun 12 generates the electron beam (S41) Then, the electron beam generated by the electron gun 12 is shaped into a first rectangle beam 300, a second rectangle beam 302, a third rectangle beam 304, and a fourth rectangle beam 306, by the opening pattern of the mask 30 (S42). Long sides of the first and second rectangle beams are substantially parallel with each other. Long sides of the third and fourth rectangle beams are substantially parallel with each other. The long sides of the first and third rectangle beams are substantially perpendicular to each other.

Figure 7C:
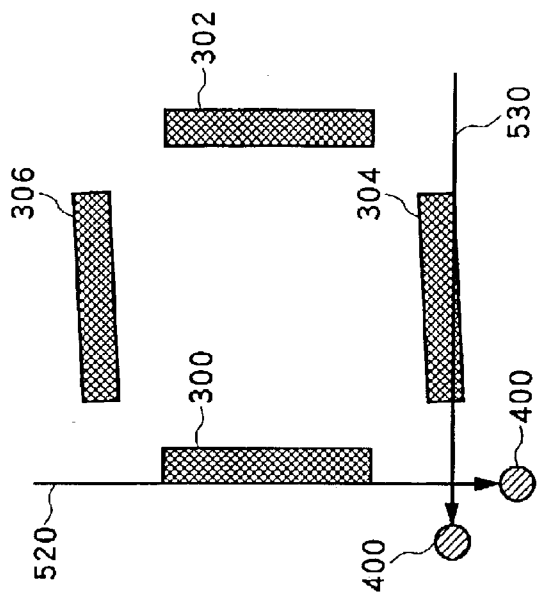
FIGS. 7A to 7D are figures explaining an electron beam irradiation step and a reflected electron processing step.
Figure 7D:
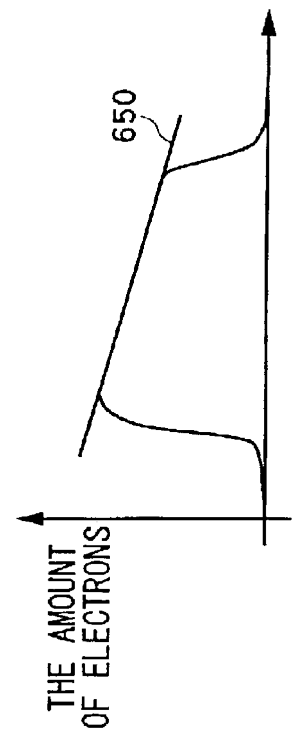
Figure 7A:
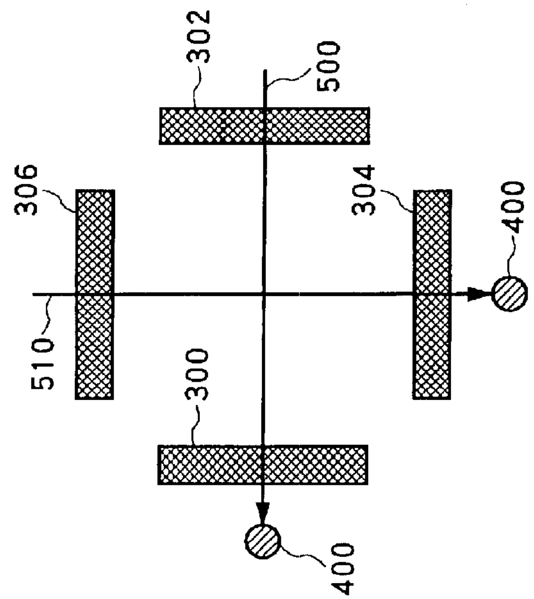
Figure 7B:
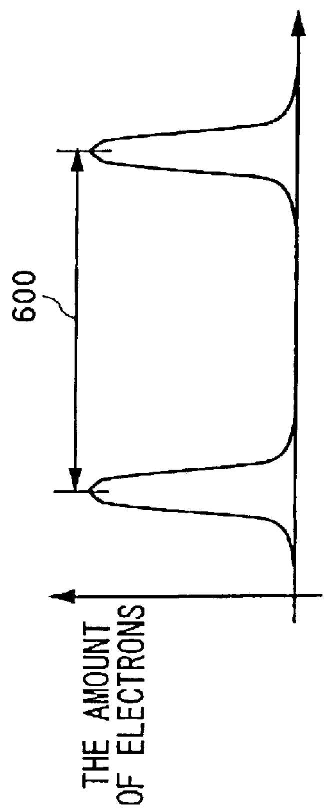

Next, as shown in FIG. 7A, the sub deflector 58 scans the first rectangle beam 300, the second rectangle beam 302, the third rectangle beam 304, and the fourth rectangle beam 306 to a direction 500, which is substantially perpendicular to the long side of the first rectangle beam 300 irradiated on the wafer, and makes the first rectangle beam 300 and the second rectangle beam 302 to be irradiated on the mark 400 of the wafer (S44). Then, the reflected electron detector 60 detects the reflected electrons generated from the mark 400 on which the first rectangle beam 300 and the second rectangle beam 302 are irradiated (S46). Then, a reflected electron processing section 90 measures the cross-sectional shapes of the first rectangle beam 300 and a second rectangle beam 302 irradiated on the wafer based on the detected reflected electrons (S48). Specifically, as shown in FIG. 7B, the reflected electron processing section 90 measures a distance 600 between the first rectangle beam 300 and the second rectangle beam 302 in a direction substantially perpendicular to the direction of the long side of the first rectangle beam 300 irradiated on the wafer based on the detection result by the reflected electron detector 60 (S48).

Moreover, as shown in FIG. 7A, the sub deflector 58 scans the first rectangle beam 300, the second rectangle beam 302, the third rectangle beam 304, and the fourth rectangle beam 306 to a direction 510, which is substantially perpendicular to the long side of the third rectangle beam 304 irradiated on the wafer, and makes the third rectangle beam 304 and the fourth rectangle beam 306 to be irradiated on the mark 400 of the wafer (S44). Then, the reflected electron detector 60 detects the reflected electrons generated from the mark 400 on which the third rectangle beam 304 and the fourth rectangle beam 306 are irradiated (S46). Then, a reflected electron processing section 90 measures the cross-sectional shapes of the third rectangle beam 304 and the fourth rectangle beam 306 irradiated on the wafer based on the detected reflected electrons (S48). Specifically, the reflected electron processing section 90 measures a distance between the third rectangle beam 304 and the fourth rectangle beam 306 in a direction substantially perpendicular to the direction of the long side of the third rectangle beam 304 irradiated on the wafer (S48).

Moreover, as shown in FIG. 7C, the sub deflector 58 scans the first rectangle beam 300, the second rectangle beam 302, the third rectangle beam 304, and the fourth rectangle beam 306 to a direction 520, which is substantially parallel with the long side of the first rectangle beam 300 irradiated on the wafer, and makes the first rectangle beam 300 to be irradiated on the mark 400 of the wafer (S44). Moreover, the sub deflector 58 scans the first rectangle beam 300, the second rectangle beam 302, the third rectangle beam 304, and the fourth rectangle beam 306 to a direction 530, which is substantially perpendicular to the long side of the first rectangle beam 300 irradiated on the wafer, and makes the third rectangle beam 304 to be irradiated on the mark 400 of the wafer (S44). Then, the reflected electron detector 60 detects the reflected electrons generated from the mark 400 on which the first rectangle beam 300 and the third rectangle beam 304 are irradiated (S46). Then, a reflected electron processing section 90 measures the cross-sectional shapes of the first rectangle beam 300 and a third rectangle beam 304 irradiated on the wafer based on the detected reflected electrons (S48). Specifically, as shown in FIG. 7D, the reflected electron processing section 90 measures the angle between a direction of a long side of the first rectangle beam 300 irradiated on the wafer and a direction of a long side of the third rectangle beam 304 irradiated on the wafer, based on a differential 650 of the amount of the reflected electrons detected by the reflected electron detector 60 (S48).

Next, the calculating section of the general control section 130 calculates the correction data for correcting the distortion of the image on the wafer of the electron beam irradiated on the wafer based on the position of the opening pattern of the mask 30, where the correction data is calculated based on the shape of the opening pattern of the mask 30 which has shaped the electron beam, and also based on the cross-sectional shapes of the first rectangle beam 300, the second rectangle beam 302, the third rectangle beam 304, and the fourth rectangle beam 306, which are measured by the reflected electron processing section 90 (S50). The correction data, which corresponds to the plurality of positions in the mask 30, is calculated by repeating the steps from the electron beam shaping step (S42) to the correction data calculation step (S50). Then, the mask memory 210 stores the calculated correction data in association with the position of the opening patterns in the mask 30.

According to the electron beam exposure apparatus 100 in the present embodiment, since the cross-sectional shape of the electron beam is measured by scanning the electron beam and making the electron beam to be irradiated on the mark 400, the cross-sectional shape of the electron beam is measured accurately without being dependent on manufacture error of the mark 400 or the like. Therefore, since the electron beam exposure apparatus 100 measures accurately the distortion of the image of the electron beam on the wafer, the correction data for accurately correcting the distortion of the image is calculated. As a result, the electron beam exposure apparatus 100 exposes the pattern accurately on the wafer by performing exposure processing based on the calculated correction data.

Moreover, the cross-sectional shape of the electron beam on the wafer is measured using the same method as the electron beam irradiation step (S44) and the reflected-electron processing step (S48) of the present embodiment. That is, the electron gun 12 generates the electron beam. Then, the mask 30 shapes the cross-sectional shape of the electron beam using the opening. Then, the sub deflector 58 makes the electron beam, which is irradiated on the wafer, to be irradiated on a mark 400, and scans the mark 400. Then, based on the electron beam irradiated on the mark 400, the cross-sectional shape of the electron beam irradiated on the wafer is measured. For example, the reflected electron detector 60 detects the reflected electrons generated from the mark 400 on which the electron beam is irradiated. Then, the reflected electron processing section 90 measures the cross-sectional shape of the electron beam irradiated on the wafer based on the detected reflected electron.

As it is obvious from the foregoing explanation, according to the present invention, there is provided the electron beam exposure apparatus for exposing the pattern accurately on the wafer.

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. An electron beam exposure apparatus for exposing a wafer by an electron beam, said apparatus comprising:

an electron beam generation section for generating the electron beam;

an electron beam shaping member with a plurality of openings for shaping the electron beam;

a fixed deflecting section for deflecting the electron beam having passed through said electron beam shaping member, said deflecting section deflecting the electron beam and correcting distortion of an image of the electron beam on the wafer; and a deflection correction control section for controlling said deflecting section to correct said distortion based on a positional relation in a perpendicular direction to which the electron beam passes between a position of an opening of said electron beam shaping member through which the electron beam passes and a reference point of said deflecting section.

2. The electron beam exposure apparatus as claimed in claim 1, wherein said deflecting section is an eight poles electrostatic deflector comprising:

a first deflecting electrode and an opposing second deflecting electrode;

a seventh deflecting electrode and an opposing eighth deflecting electrode, which are disposed at an angle of 90 degrees on an axis of said deflecting section from said first deflecting electrode and said second deflecting electrode respectively;

a third deflecting electrode and an opposing fourth deflecting electrode, which are disposed at an angle of 45 degrees on the axis of said deflecting section from said first deflecting electrode and said second deflecting electrode; and a fifth deflecting electrode and an opposing sixth deflecting electrode, which are disposed at an angle of 45 degrees on the axis of said deflecting section from each of said seventh deflecting electrode and said eighth deflecting electrode, and said deflection correction control section calculates deflecting electrode applied-voltage applied to each of said first deflecting electrode, said second deflecting electrode, said third deflecting electrode, said fourth deflecting electrode, said fifth deflecting electrode, said sixth deflecting electrode, said seventh deflecting electrode, and said eighth deflecting electrode, based on deflection data (X, Y) and correction data ($\alpha$, $\beta$) for correcting the distortion of the image of the electron beam on the wafer.

3. The electron beam exposure apparatus as claimed in claim 2, wherein said deflection correction control section calculates the deflecting electrode applied-voltage $V_1$, $V_2$, $V_7$, and $V_8$ applied to said first deflecting electrode, said second deflecting electrode, said seventh deflecting electrode, and said eighth deflecting electrode respectively based on the correction data $\alpha$, and calculates the deflecting electrode applied-voltage $V_3$, $V_4$, $V_5$, and $V_6$ applied to said third deflecting electrode, said fourth deflecting electrode, said fifth deflecting electrode, and said sixth deflecting electrode respectively based on the correction data $\beta$.

4. The electron beam exposure apparatus as claimed in claim 3, wherein said deflection correction control section calculates the deflecting electrode applied-voltage $V_1$, $V_2$, $V_3$, $V_4$, $V_5$, $V_6$, $V_7$, and $V_8$ using following equations:

$$V_1=X\cdot c+Y\cdot s+\alpha$$

$$V_2=-X\cdot c-Y\cdot s+\alpha$$

$$V_3=X\cdot s+Y\cdot c+\beta$$

$$V_4=-X\cdot s-Y\cdot c+\beta$$

$$V_5=X\cdot c-Y\cdot s-\beta$$

$$V_6=-X\cdot c+Y\cdot s-\beta$$

$$V_7=X\cdot s-Y\cdot c-\alpha$$

$$V_8=-X\cdot s+Y\cdot c-\alpha$$

where constants c and s are defined according to geometrical relationship among said first deflecting electrode, said second deflecting electrode, said third deflecting electrode, said fourth deflecting electrode, said fifth deflecting electrode, said sixth deflecting electrode, said seventh deflecting electrode, said eighth deflecting electrode, and X, Y axes.

5. The electron beam exposure apparatus as claimed in claim 1, wherein said deflecting section deflects the electron beam which has passed through said electron beam shaping member so that the direction of the electron beam becomes substantially parallel with an optical axis of an electron beam which is not deflected by an electron optics system.

6. The electron beam exposure apparatus as claimed in claim 1, further comprising a mask memory for storing correction data for correcting distortion of the image of the electron beam on the wafer in association with the position of said openings, wherein said deflection correction control section controls said deflecting section based on the correction data stored in said mask memory.

7. The electron beam exposure apparatus as claimed in claim 6, further comprising another deflecting section for deflecting the electron beam generated by said electron beam generation section to the position of the opening of said electron beam shaping member based on the deflection data stored in said mask memory.

8. An electron beam exposure method for exposing a wafer by an electron beam, said method comprising:

generating the electron beam;

shaping the electron beam by an electron beam shaping member with a plurality of openings for shaping the electron beam;

deflecting the electron beam having passed through the electron beam shaping member by a fixed deflector, and correcting distortion of an image of the electron beam on the wafer based on a positional relation in a perpendicular direction to which the electron beam passes between a position of an opening in the electron beam shaping member through which electron beam passes and a reference point of said deflector; and exposing the wafer.

9. The electron beam exposure method as claimed in claim 8, further comprising a step of measuring a cross-sectional shape of the electron beam, which has passed through the opening of said electron beam shaping member and is irradiated on the wafer, wherein said deflecting and correcting step comprises a step of controlling the amount of deflection correction of the electron beam based on the cross-sectional shape measured in said measurement step.

10. The electron beam exposure method as claimed in claim 9, wherein said measurement step comprises steps of:

shaping the electron beam into a first rectangle beam and a second rectangle beam where long sides of the first and second rectangle beams are substantially parallel with each other;

scanning the first rectangle beam and the second rectangle beam to a direction substantially perpendicular to a direction of the long side of the first rectangle beam irradiated on the wafer, and irradiating the first rectangle beam and the second rectangle beam on a mark provided on the wafer;

detecting the reflected electrons generated from the mark on which the first rectangle beam and the second rectangle beam are irradiated;

processing the reflected electrons by measuring the cross-sectional shape of the first rectangle beam and the second rectangle beam irradiated on the wafer based on the reflected electrons which are detected; and calculating correction data for correcting distortion of an image of the electron beam irradiated on the wafer based on the position of the opening of the electron beam shaping member, which is based on a shape of the opening in which the electron beam is shaped in the electron beam shaping member and also based on the cross-sectional shape of the measured first rectangle beam and the second rectangle beam; wherein said deflecting and correcting step controls the amount of deflection correction of the electron beam irradiated on the wafer based on the correction data.

11. The electron beam exposure method as claimed in claim 10, wherein said reflected electron processing step further comprises a step of measuring a distance between the first rectangle beam and the second rectangle beam in a direction substantially perpendicular to the direction of the long side of the first rectangle beam irradiated on the wafer, and said calculation step calculates the correction data for correcting the distortion of the image of the electron beam irradiated on the wafer based on the distance between the first rectangle beam and the second rectangle beam.

12. The electron beam exposure method as claimed in claim 11, wherein, said measurement electron beam shaping step comprises a step of shaping the electron beam into the first rectangle beam, the second rectangle beam, a third rectangle beam, and a fourth rectangle beam, where long sides of the first and second rectangle beams are substantially parallel with each other and long sides of the third and fourth rectangle beams are substantially parallel with each other and the long sides of the first and third rectangle beams are substantially perpendicular to each other, said irradiation step further comprises steps of scanning the first rectangle beam, the second rectangle beam, the third rectangle beam, and the fourth rectangle beam in a direction substantially perpendicular to the direction of the long side of the third rectangle beam irradiated on the wafer, and irradiating the first rectangle beam, the second rectangle beam, the third rectangle beam, and the fourth rectangle beam on the mark provided on the wafer, and said detection step comprises a step of detecting reflected electrons generated from the mark on which the first rectangle beam, the second rectangle beam, the third rectangle beam, and the fourth rectangle beam are irradiated, said reflected electron processing step further comprises a step of measuring a distance between the third rectangle beams and the fourth rectangle beams in a direction substantially perpendicular to the direction of the long side of the third rectangle beam irradiated on the wafer based on the detected reflected electrons, and said calculation step calculates the correction data for correcting distortion of an image of the electron beam irradiated on the wafer based on the distance between the third rectangle beam and the fourth rectangle beam.

13. The electron beam exposure method as claimed in claim 9, wherein said measurement step comprises steps of:

shaping the electron beam into a first rectangle beam and a second rectangle beam where long sides of the first and second rectangle beams are substantially parallel with each other;

scanning the first rectangle beam and the second rectangle beam to a direction substantially perpendicular to a direction of the long side of the first rectangle beam irradiated on the wafer, and irradiating the first rectangle beam and the second rectangle beam on a mark provided on the wafer;

detecting the reflected electrons generated from the mark on which the first rectangle beam and the second rectangle beam are irradiated;

processing the reflected electrons by measuring the cross-sectional shape of the first rectangle beam and the second rectangle beam irradiated on the wafer based on the reflected electrons which are detected; and calculating correction data for correcting distortion of an image of the electron beam irradiated on the wafer based on the position of the opening of the electron beam shaping member, which is based on a shape of the opening in which the first rectangle beam and the second rectangle beam are shaped in the electron beam shaping member and also based on the cross-sectional shape of the measured first rectangle beam and the second rectangle beam; wherein said deflecting and correcting step controls the amount of the deflection correction of the electron beam irradiated on the wafer based on the correction data.

14. The electron beam exposure method as claimed in claim 13 wherein, said reflected electron processing step further comprises a step of measuring an angle between a direction of a long side of the first rectangle beam irradiated on the wafer and a direction of a long side of the second rectangle beam irradiated on the wafer make, and said calculation step calculates the correction data for correcting distortion of an image of the electron beam irradiated on the wafer based on the angle between the direction of the long side of the first rectangle beam and the direction of the long side of the second rectangle beam.

15. A semiconductor device manufacturing method of exposing a wafer by an electron beam and manufacturing a semiconductor device, said method comprising:

generating the electron beam;

shaping the electron beam by an electron beam shaping member with a plurality of openings for shaping the electron beam;

deflecting the electron beam having passed through the electron beam shaping member by a fixed deflector, and correcting distortion of an image of the electron beam on the wafer based on a positional relation in a perpendicular direction to which the electron beam passes between a position of an opening in the electron beam shaping member through which the electron beam passes and a reference point of said deflector; and exposing the wafer.

16. An electron beam shape measuring method of measuring a cross-sectional shape of an electron beam, said method comprising:

generating the electron beam;

shaping the cross-sectional shape of the electron beam;

scanning the electron beam and irradiating the electron beam on a mark;

measuring the cross-sectional shape of the electron beam based on the electron beam irradiated on the mark; and obtaining correction data of the electron beam from an inclination along one side of the cross-sectional shape of the electron beam.

17. The electron beam shape measuring method as claimed in claim 16, further comprising a step of detecting the reflected electrons generated from the mark on which the electron beam is irradiated, wherein said shape measurement step measures the cross-sectional shape of the electron beam based on the detected reflected electrons.

* * * * *